United States Patent
Han et al.

(10) Patent No.: US 7,154,124 B2
(45) Date of Patent: Dec. 26, 2006

(54) NITRIDE SEMICONDUCTOR LIGHT EMITTING DEVICE AND METHOD FOR MANUFACTURING THE SAME

(75) Inventors: Young Suk Han, Kyungki-do (KR); Sung Wook Kim, Kyungki-do (KR); Suk Kil Yoon, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 67 days.

(21) Appl. No.: 10/859,146

(22) Filed: Jun. 3, 2004

(65) Prior Publication Data

US 2005/0133811 A1 Jun. 23, 2005

(30) Foreign Application Priority Data

Dec. 23, 2003 (KR) .............................. 2003-95171

(51) Int. Cl.
*H01L 33/00* (2006.01)
(52) U.S. Cl. .......................................... 257/88; 257/91
(58) Field of Classification Search ........... 257/77–103
See application file for complete search history.

(56) References Cited

U.S. PATENT DOCUMENTS 5,652,434 A 7/1997 Nakamura et al.
5,698,865 A 12/1997 Gerner et al.
6,337,493 B1 * 1/2002 Tanizawa et al. .............. 257/94
6,614,056 B1 * 9/2003 Tarsa et al. .................... 257/91

OTHER PUBLICATIONS

Patent Abstracts of Japan—Publication No. 09-097922, Published Apr. 8, 1997.
Patent Abstracts of Japan—Publication No. 10-275934, Publication Oct. 13, 1998.

* cited by examiner

*Primary Examiner*—Cuong Nguyen
(74) *Attorney, Agent, or Firm*—Lowe Hauptman & Berner, LLP.

(57) ABSTRACT

A nitride semiconductor light emitting device includes a substrate, an n-type nitride semiconductor layer formed on the substrate and provided with an electrode region of a predetermined area adjacent to a center of one lateral side of the top surface of the substrate, an n-type electrode formed on the electrode region, an activation layer, a p-type nitride semiconductor layer, and a p-type electrode which has a bonding pad adjacent to a center of another lateral side opposite to the lateral side adjacent to the electrode region to have a predetermined space from the n-type electrode and a band-shaped extension connected to the bonding pad to extend along a lateral side of the top surface of the p-type nitride semiconductor layer in opposite directions from a connected portion of the extension with the bonding pad.

3 Claims, 7 Drawing Sheets

NITRIDE SEMICONDUCTOR LIGHT EMITTING DEVICE AND METHOD FOR MANUFACTURING THE SAME

BACKGROUND OF THE INVENTION

1. Field of the Invention

The present invention relates to a nitride semiconductor light emitting device, and more particularly to a nitride semiconductor light emitting device and a method of manufacturing the same, which can provide an improved electrode structure for the nitride semiconductor light emitting device to have uniform current diffusion and an increased current diffusion efficiency, thereby providing an enhanced brightness and driving voltage characteristics, and which can prevent a bonding wire from blocking a light emitting region when manufacturing a package, thereby preventing reduction in brightness after manufacturing the package.

2. Description of the Related Art

Recently, a light emitting device (LED) display board developed as a new transmission media for images or information has been advanced to a level of displaying a moving image, such as various CF images, graphic images, video display, etc., starting from information of simple characters or figures in the early days of the LED display board. With regard to colors, not limited to an existing monochromatic coarse display or at most a limited range of colors, such as red or yellow-green LEDs, in the past, as a high brightness blue LED using a nitride semiconductor has emerged recently, it has become possible to exhibit a full color display using colors of red, yellow-green and blue. However, since the yellow-green LED has a lower brightness than that of the blue LED or the red LED and emits light having a wavelength of 565 nm or so which is not the wavelength of green required for the three primary colors, it is not possible to display the full range of natural colors. These problems are overcome using a high brightness pure green nitride semiconductor LED emitting a wavelength of 525 nm suitable for displaying the full range of natural colors.

In such a nitride semiconductor light emitting device, since there is no commercially available substrate which has an identical crystal structure to that of a nitride crystal and which is in lattice matching with the nitride crystal, the nitride semiconductor material is grown on a sapphire substrate as a dielectric substrate. Since the nitride semiconductor light emitting device has the semiconductor material grown on the dielectric substrate, such as the sapphire substrate, electrodes cannot be formed on the back side of the substrate, necessitating formation of both electrodes on a crystal growth side of the semiconductor layer. An electrode structure of a conventional nitride semiconductor light emitting device and a cross-sectional structure thereof are exemplified in FIGS. 1 to 3.

FIG. 1a is a plan view of the conventional nitride semiconductor light emitting device, in which the conventional nitride semiconductor light emitting device 1 has an approximately rectangular shape and is formed with an n-type electrode 1n at one edge of the nitride semiconductor light emitting device and with a p-type electrode 1p at the center of an upper surface of the nitride semiconductor light emitting device. FIG. 1b is a cross-sectional view of the nitride semiconductor light emitting device taken along line $l_1$–$l_1'$ of FIG. 1a. As shown in FIG. 1b, the conventional nitride semiconductor light emitting device comprises: a sapphire substrate 11 of an approximately rectangular shape; a buffer layer 12 for preventing lattice mismatching in order to grow a nitride semiconductor material on the sapphire substrate 11; an n-type nitride semiconductor layer 13 formed on the buffer layer 12; an n-type electrode 17n formed on the n-type nitride semiconductor layer 13; an activation layer 14 formed on the n-type nitride semiconductor layer 13 such that an edge of the n-type nitride semiconductor layer 13 can be exposed; a p-type nitride semiconductor layer 15 formed on the activation layer 14; a transparent electrode layer 16 formed on the p-type nitride semiconductor layer 15 for providing an ohmic contact; and a p-type electrode 17p formed on the transparent electrode layer 16.

In general, the entire surface of the light emitting device can define a light emitting region (p-n junction), which emits light generated in the activation layer. However, in the electrode structure of the conventional nitride semiconductor light emitting device shown in FIG. 1, the p-type and the n-type electrodes are narrowly formed, thereby providing a low electric current diffusivity, and the p-n junction substantially contributing to the light emitting is formed around regions through which the electric current indicated by arrows in the drawings passes, thereby making it difficult to provide a high brightness. Additionally, as indicated by the arrows in FIG. 1a, the distance of current diffusion varies, making it difficult to provide uniform current diffusion, thereby reducing the brightness.

Further, since the conventional nitride semiconductor light emitting device shown in FIG. 1 has the p-type electrode formed at the center of the upper surface of the nitride semiconductor light emitting device, when the package is formed using a bonding wire, the light emitting region is blocked by the bonding wire, as indicated by symbol A' of FIG. 4, so that there is a problem that the brightness is further reduced after the package is manufactured.

In order to solve the problems of the conventional nitride semiconductor light emitting device as described above, an enhanced nitride semiconductor light emitting device as shown in FIGS. 2a, 2b and 3 is developed. The nitride semiconductor light emitting device shown in FIGS. 2a and 2b is formed with an n-type electrode 2n or 27n of a band shape around the periphery of an upper surface of the n-type nitride semiconductor layer 23 and with a p-type electrode 2p or 27p at the center of the p-type nitride semiconductor layer 25 (or the center of the transparent electrode layer 26). As indicated by the arrows in FIG. 2a, since the diffusion of the electric current from the p-type electrode 2p or 27p to the n-type electrode 2n or 27n generally occurs over the entire light emitting region (p-n junction) in a constant distance, there is provided an advantageous effect that the diffusion of the electric current can be uniformly carried out, thereby enhancing the brightness.

However, there still exists the problem that since the p-type electrode 2p and 27p is disposed at the center of the light emitting region, the bonding wire blocks the light emitting region when manufacturing the package as shown in FIG. 4, thereby reducing the brightness. Additionally, the method of manufacturing the nitride semiconductor light emitting device shown in FIGS. 2a and 2b should be accompanied by an etching process for exposing some portions of the periphery of the n-type semiconductor layer 23 in order to form the n-type electrode 2n or 27n thereon, and be formed with an n-type electrode having a narrow band shape on the exposed region around the periphery of the n-type semiconductor layer 23, thereby resulting in a complicated manufacturing process. Further, the complicated and difficult process as described above increases manufacturing costs for the nitride semiconductor light emitting device. Further, there is provided a problem of damaging the n-type electrode, during a scribing process for dividing a plurality of light emitting device formed on a wafer into separate chips.

Meanwhile, the nitride semiconductor light emitting device as shown in FIGS. 3a and 3b has an n-type electrode 3n or 37n formed on the n-type nitride semiconductor layer 33 such that like the conventional nitride semiconductor light emitting device shown in FIGS. 1a and 1b, some portions of an edge of the n-type nitride semiconductor layer 33 are exposed, and a p-type electrode 3p or 37p formed at the edge of the p-type nitride semiconductor layer 25 (or at the edge of the transparent electrode layer 36) opposite to the edge formed with the n-type electrode. In such a conventional nitride semiconductor light emitting device, there are provided advantageous effects that as indicated by the arrows in FIG. 3, the diffusion of the electric current can be generally carried out at the light emitting region, and that as shown in FIG. 5, the bonding wire does not block the light emitting region B after the package is produced.

However, a longer diagonal line between the edges formed with respective electrodes provides a longer distance through which the electric current passes, resulting in a non-uniform diffusion of the electric current, so that the difference between the brightness at the center of the light emitting region and that at the surrounding portions thereof increases. Particularly, since two electrodes are formed as points, there is provided a problem of reducing total current diffusivity.

Thus, there is a need to provide a nitride semiconductor light emitting device and a method of manufacturing the same, which is formed with the p-type electrode and the n-type electrode such that uniform light emission can occur at the entire light emitting region having the p-n junction, thereby realizing high brightness characteristics.

SUMMARY OF THE INVENTION

Therefore, the present invention has been made in view of the above problems, and it is an object of the present invention to provide a nitride semiconductor light emitting device, which is formed with an electrode structure for providing uniform current diffusion, thereby enhancing brightness.

It is another object of the present invention to provides a method of manufacturing the nitride semiconductor light emitting device, which is formed with an electrode structure for providing uniform current diffusion, thereby enhancing brightness.

In accordance with an aspect of the present invention, the above and other objects can be accomplished by the provision of a nitride semiconductor light emitting device, comprising: a substrate having an approximately rectangular top surface; an n-type nitride semiconductor layer formed on the substrate and provided with an electrode region of a predetermined area adjacent to a center of one lateral side of the top surface of the substrate; an n-type electrode formed on the electrode region; an activation layer comprising an un-doped nitride semiconductor material and formed on the n-type nitride semiconductor layer such that the electrode region is exposed; a p-type nitride semiconductor layer formed on the activation layer; and a p-type electrode formed on the p-type nitride semiconductor layer, the p-type electrode having a bonding pad adjacent to a center of another lateral side opposite to the lateral side adjacent to the electrode region to have a predetermined space from the n-type electrode and having a band-shaped extension connected to the bonding pad to extend along a lateral side of the top surface of the p-type nitride semiconductor layer in opposite directions from a connected portion of the extension with the bonding pad.

Preferably, the extension is formed along the lateral side adjacent to the bonding pad. More preferably, the extension is formed along the lateral side adjacent to the bonding pad and along opposite lateral sides at which the n-type and p-type electrodes are not formed.

The nitride semiconductor light emitting device of the present invention may further comprise a buffer layer formed on the top surface of the substrate for providing lattice matching, and a transparent layer formed on the top surface of the p-type nitride semiconductor layer for providing an ohmic contact.

It is another aspect of the present invention to provide a method of manufacturing a nitride semiconductor light emitting device, comprising the steps of: providing a substrate having an approximately rectangular top surface; forming an n-type nitride semiconductor layer on the substrate; forming an activation layer comprising an un-doped nitride semiconductor material on the n-type nitride semiconductor layer; forming a p-type nitride semiconductor layer on the activation layer; removing some portions of the p-type nitride semiconductor layer and activation layer to expose an electrode region of a predetermined area adjacent to a center of a lateral side of the top surface of the n-type nitride semiconductor layer; forming an n-type electrode on the electrode region; and forming a p-type electrode on the p-type nitride semiconductor layer, the p-type electrode having a bonding pad formed adjacent to a center of a lateral side opposite to the lateral side adjacent to the electrode region with a predetermined space from the n-type electrode and having a band-shaped extension connected to the bonding pad to extend along a lateral side of the top surface of the p-type nitride semiconductor layer in opposite directions from a connected portion of the extension with the bonding pad.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 6A:
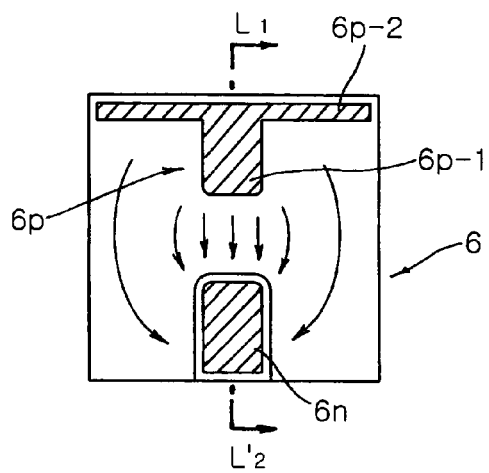
FIGS. 6a and 6b are plan views of nitride semiconductor light emitting devices according to two embodiments of the present invention, respectively.
Figure 6B:
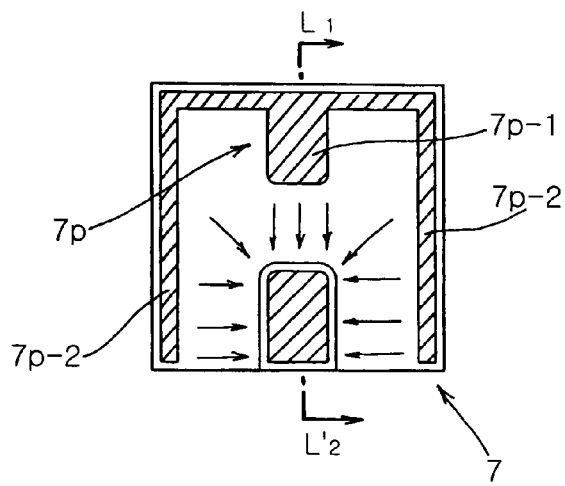
Figure 6C:
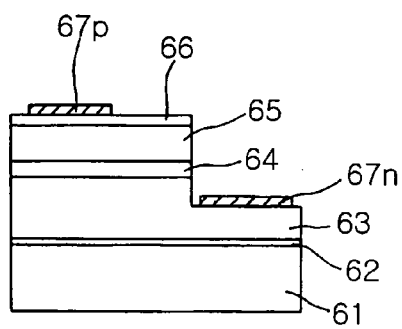
FIG. 6c is a cross sectional view of the nitride semiconductor light emitting devices according to the embodiments of the present invention, taken along lines $L_1$–$L_1'$ and $L_2$–$L_2'$ of FIGS. 6a and 6b.

FIGS. 6a and 6b are plan views of nitride semiconductor light emitting devices according to two embodiments of the present invention, respectively. FIG. 6c is a cross sectional view of the nitride semiconductor light emitting devices according to the embodiments of the present invention, taken along lines $L_1$–$L_1'$ and $L_2$–$L_2'$ of FIGS. 6a and 6b.

Referring to FIGS. 6a and 6c, a nitride semiconductor light emitting device 6 according to a first embodiment of the present invention comprises: a substrate 61 having an approximately rectangular top surface; an n-type nitride semiconductor layer 63 formed on the substrate 61 and provided with an electrode region of a predetermined area adjacent to the center of one lateral side of the top surface of the substrate; an n-type electrode 67n or 6n formed on the n-type nitride semiconductor layer 63; an activation layer 64 comprising an un-doped nitride semiconductor material and formed on the n-type nitride semiconductor layer 63 such that the electrode region is exposed; a p-type nitride semiconductor layer 65 formed on the activation layer 64; and a p-type electrode 67p or 6p formed on the p-type nitride semiconductor layer 65. The p-type electrode 67p or 6p comprises a bonding pad 6p-1 adjacent to the center of a lateral side opposite to the lateral side adjacent to the electrode region to have a predetermined space from the n-type electrode, and a band-shaped extension 6p-2 connected to the bonding pad to extend along the lateral side of the top surface of the p-type nitride semiconductor layer in opposite directions from a connected portion with the bonding pad. Here, except for a portion formed with the electrode region, the top surface of the semiconductor light emitting device is formed of a p-n junction at a lower portion thereof, thus becoming a light emitting region.

The nitride semiconductor light emitting device 6 of the embodiment further comprises a buffer layer 62 formed on the top surface of the substrate 61 for providing lattice matching, and a transparent layer 66 formed on the top surface of the p-type nitride semiconductor layer 65 for providing an ohmic contact.

As for the substrate 61, a sapphire substrate or a SiC substrate can be used. This is attributed to the fact that there is no commercial substrate, which has an identical crystal structure to that of the nitride semiconductor material grown on the substrate, concurrently providing lattice matching. The nitride semiconductor layers formed on the substrate 61 may generally comprise a nitride, such as GaN, InN, AlN (III–IV group) or the like, and a nitride compound mixing the above nitrides in a predetermined ratio, and more preferably, GaN semiconductor layers are generally used. The nitride semiconductor material has the formula $Al_xIn_yGa_{(1-x-y)}N$ (where $0 \leq x \leq 1$, $0 \leq y \leq 1$, $0 \leq x+y \leq 1$). Crystal growth of the nitride semiconductor material can be achieved using a well-known deposition process, such as MOCVD (Metal Organic Chemical vapor Deposition) process or MBE (Molecular Beam Epitaxy) process. The MOCVD process is a process for growing a crystal on the substrate as an epitaxial layer by supplying an organic compound reaction gas to a reaction vessel at a temperature of 700~1200° C. As such, when the epitaxial layer is grown on the substrate or on the SiC layer, a lower temperature grown layer, what is called a buffer layer 62, should be formed on the substrate to provide good crystal growth by removing stress due to the lattice mismatching. The buffer layer 62 may comprise GaN.

The n-type nitride semiconductor layer 63 may comprise GaN doped with Si. The activation layer 64 may comprise GaN or InGaN having an un-doped quantum well structure. The p-type nitride semiconductor layer 65 may comprise GaN doped with Mg.

The p-type nitride semiconductor layer 65 may be formed with the transparent layer 66 thereon. For the light emitting device for generating a green light, the GaN semiconductor material with a large energy band gap of about 3.4 eV is generally used. Like the GaN semiconductor material, since the nitride-based semiconductor has a large energy band gap, there is difficulty in providing the ohmic contact with electrodes therein. More specifically, a contact resistance around a p-side electrode increases, thereby increasing an operating voltage and heat generation of the device. As for a method for providing the ohmic contact, a method of forming a transparent layer using a bi-layer of Ni/Au or an ITO layer is best known in the art among various methods having been suggested.

The laminated structure of the nitride semiconductor light emitting device, which comprises the substrate 61, the buffer layer 62, the n-type nitride semiconductor layer 63, the activation layer 64, the p-type nitride layer 65 and the transparent layer 66, as described above, is also applied to a second embodiment of the present invention, which will be described hereinafter.

The present invention is primarily characterized by the structure of the p-type electrode 67p and the n-type electrode 67n for supplying power to the nitride semiconductor device. The enhanced structure of the electrodes in the present invention provides advantageous effects of enhancements in a current diffusivity in the nitride semiconductor device, in brightness characteristics and in driving voltage only by improving a metal patterning process, without greatly changing the manufacturing process and materials to be used for the nitride semiconductor light emitting device.

The nitride semiconductor light emitting device according to the first embodiment of the present invention is formed with the n-type electrode 67n or 6n on the electrode region having the predetermined area adjacent to the center of the lateral side of the top surface of the n-type nitride semiconductor layer 63; a p-type nitride semiconductor layer 65 formed on the activation layer 64; and a p-type electrode 67p or 6p formed on the p-type nitride semiconductor layer 65. The p-type electrode 67p or 6p is formed with the bonding pad 6p-1 adjacent to the center of the lateral side opposite to the lateral side adjacent to the electrode region to have a predetermined space from the n-type electrode, and with the band-shaped extension 6p-2 connected to the bonding pad to extend along the lateral side of the top surface of the p-type nitride semiconductor layer in opposite directions from a connected portion with the bonding pad.

Figure 1A:
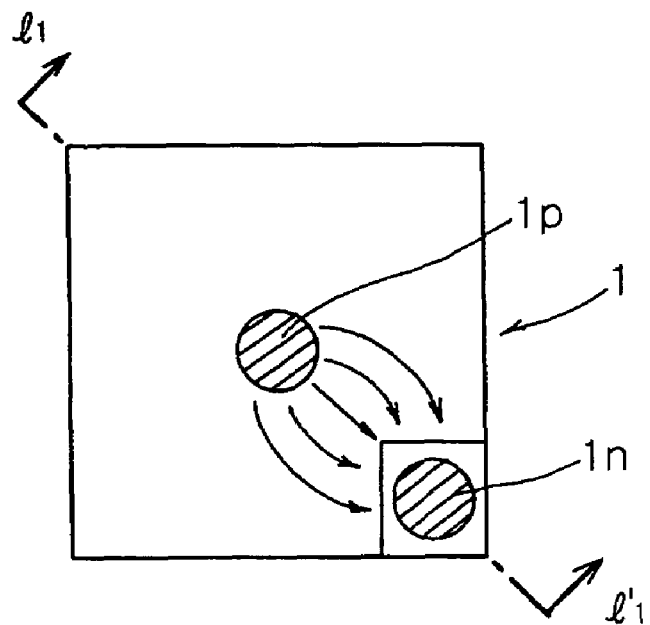
FIGS. 1a and 1b are a plan view and a cross sectional view of a conventional nitride semiconductor light emitting device, respectively.
Figure 1B:
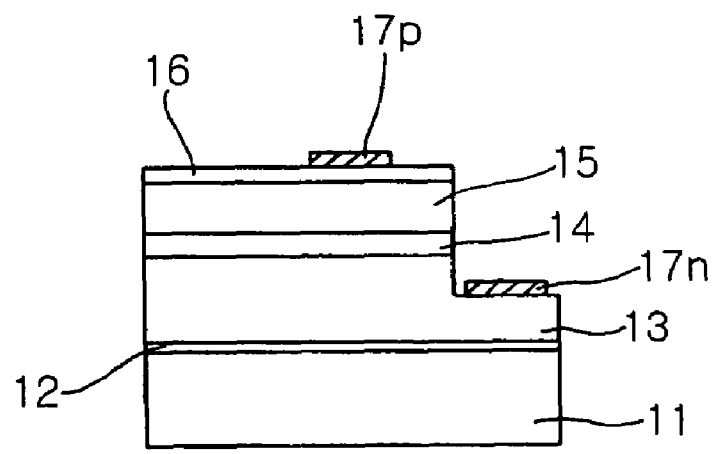
Figure 2A:
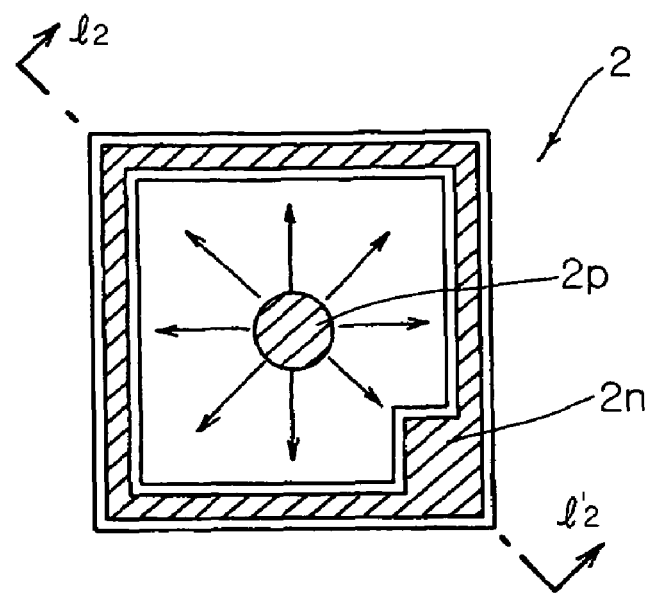
FIGS. 2a and 2b are a plan view and a cross sectional view of another conventional nitride semiconductor light emitting device, respectively.
Figure 2B:
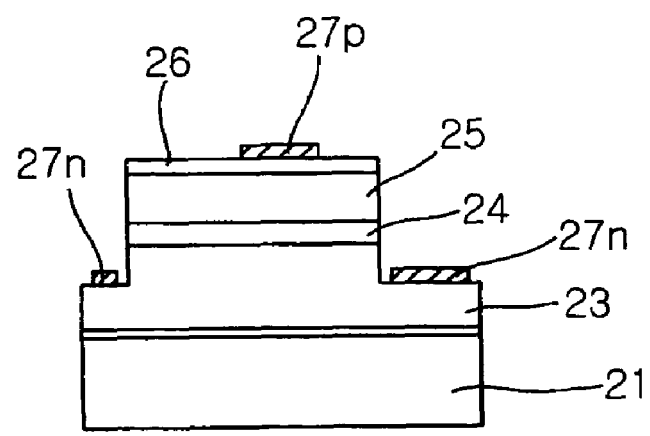
Figure 3A:
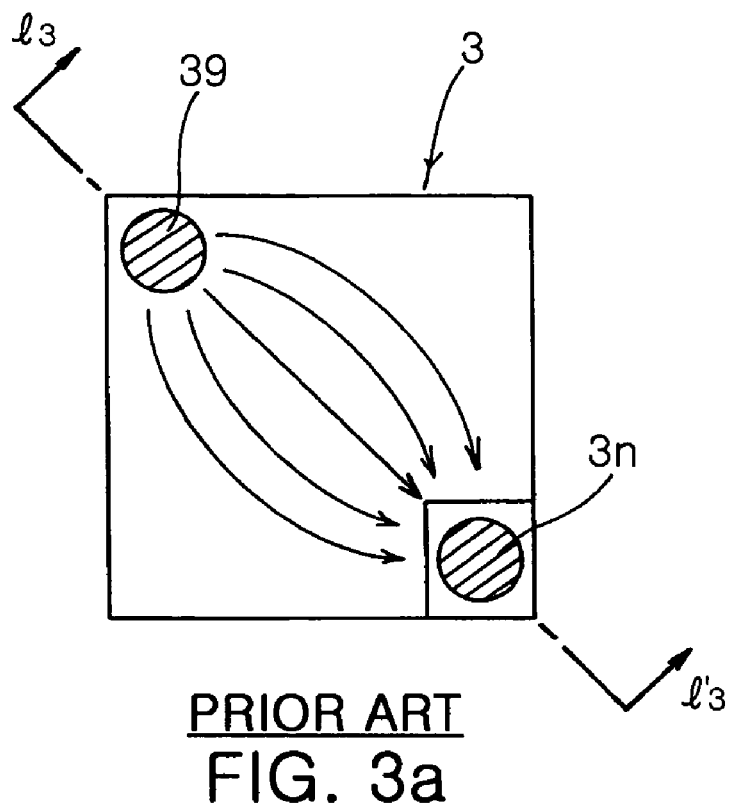
FIGS. 3a and 3b are a plan view and a cross sectional view of yet another conventional nitride semiconductor light emitting device, respectively.
Figure 3B:
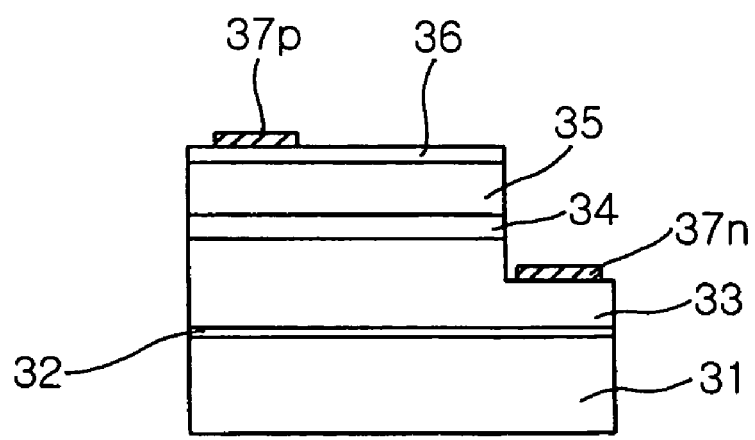
Figure 4:
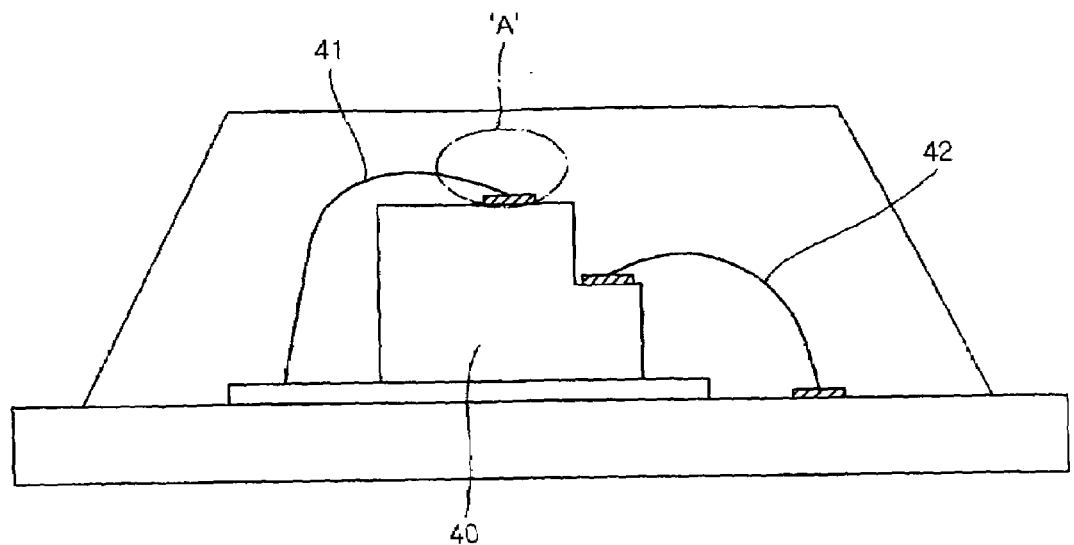
FIG. 4 is an exemplary view illustrating an example of a package using the nitride semiconductor light emitting device.
Figure 5:
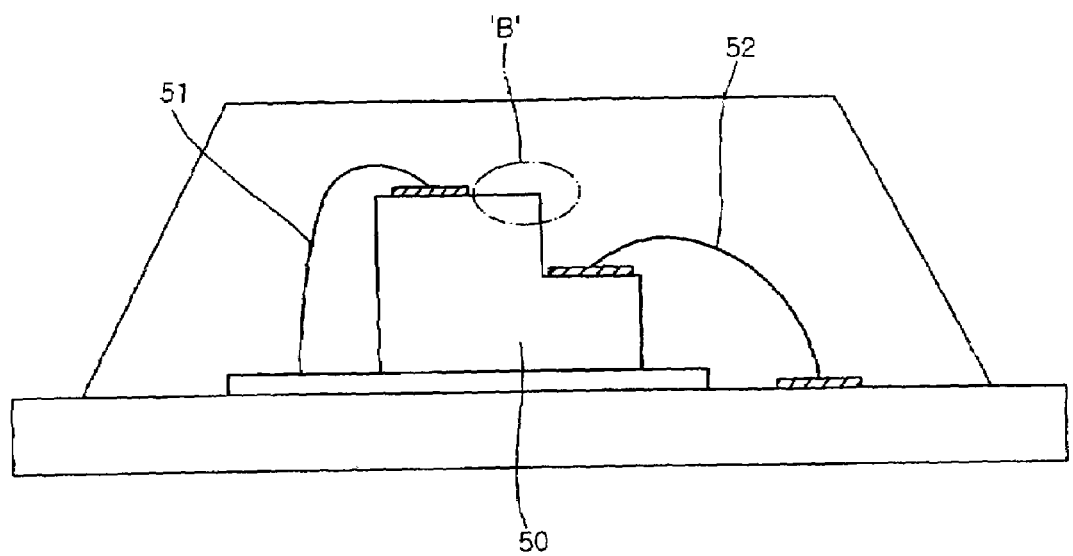
FIG. 5 is an exemplary view illustrating another example of a package using the nitride semiconductor light emitting device.

The electrode structure of the present embodiment provides a flow of the electric current as indicated by the arrows in FIG. 6a. Unlike the conventional light emitting device as shown in FIGS. 1 and 2, since the bonding pad 6p-1 is formed adjacent to one lateral side in the electrode structure of the present embodiment, the electrodes are not formed at the center of the light emitting region. Thus, when manufacturing the package, the bonding pad does not block the light emitting region as shown in FIG. 5, so that the brightness is not reduced after manufacturing the package.

Further, after the n-type electrode 6n is formed adjacent to the center of the lateral side and the bonding pad 6p-1 is formed adjacent to the center of another lateral side opposite to the lateral side formed with the n-type electrode 6n, the band-shaped extension 6p-2 is provided along the lateral side in opposite directions from the adjacent portion of the center of another lateral side as mentioned above. Thus, the electric current uniformly flows over the entire light emitting region, and the distance passed by the electric current also becomes approximately constant. That is, in accordance with the present embodiment, the electric current stably flows over the entire light emitting region, improving the efficiency of current diffusion leading to enhanced brightness. Further, the electric current can flow stably over the entire light emitting region, thereby enhancing driving voltage characteristics (that is, lowering the driving voltage). Particularly, since the bonding pad of the p-type electrode and the n-type electrode are formed adjacent to each center of opposite sides of the light emitting region to have a predetermined space from each other, the light emitting efficiency may be especially enhanced at the center of the light emitting efficiency.

However, in the first embodiment of the present invention as described above, the distance passed by the electric current is more or less increased as the distance from the center of the light emitting region is increased, so that the current diffusion at the center of the light emitting device is different from the current diffusion of the surroundings of the light emitting device. That is, although the brightness is excellently enhanced at the center of the light emitting region, the brightness can be decreased far from the center thereof. A second embodiment of the present invention for enhancing the drawback of the first embodiment will now be described.

FIG. 6b is a plan view of a nitride semiconductor light emitting devices according to the second embodiment of the present invention. The lamination structure of the second embodiment and materials in each layer thereof are the same as those of the first embodiment of the present invention, as shown in FIG. 6c. However, the second embodiment has an enhanced structure of the p-type electrode 7p to enable a more uniform current diffusion than the first embodiment.

In the second embodiment of the present invention, an n-type electrode 7n is formed on an electrode region having a predetermined area adjacent to the center of one lateral side of the top surface of an n-type nitride semiconductor layer. A p-type electrode 7p is formed on the p-type nitride semiconductor layer, and provided thereon with a bonding pad 7p-1 adjacent to the center of another lateral side opposite to the lateral side adjacent to the electrode region to have a predetermined space from the n-type electrode 7n. The p-type electrode 7p is further provided with an extension 7p-2 connected to the bonding pad 7p-1, such that the band-shaped extension 7p-2 extends along a lateral side of the top side of the p-type nitride semiconductor layer in the opposite directions from the connected portion of the bonding pad with the band-shaped extension 7p-2 and is bent to extend along opposite lateral sides at which the n-type electrode 7n and the p-type bonding pad 7p-1 are not formed.

The electrode structure of the second embodiment provides a flow of the electric current as indicated by the arrows in FIG. 6b. Since the extension 7p-2 is formed along the opposite lateral sides at which the n-type electrode 7n and the p-type bonding pad 7p-1 are not formed, the distance between the bonding pad portion 7p-1 and the n-type electrode 7n is approximately the same as that between the extension 7p-2 and the n-type electrode 7n. Thus, the current diffusion becomes approximately uniform, thereby enhancing the brightness. When compared with the first embodiment, the distance between the n-type and p-type electrodes is provided almost the same at the surroundings of the light emitting region as well as the center of the light emitting region, so that the current diffusion is uniform (that is, increased in current diffusion efficiency), thereby providing more enhanced brightness than the first embodiment.

With the first and second embodiments of the present invention, the bonding pad of the p-type electrode and the n-type electrode are formed adjacent to respective centers of the opposite lateral sides of the light emitting region, so that the center of the light emitting region may be secured as an effective light emitting region. As shown in FIG. 5, the light emitting region is not blocked by the bonding wire when manufacturing the package, so that the brightness is not reduced after manufacturing the package. Further, the band shaped p-type electrode provides an advantageous effect of eliminating an additional process of the conventional process for forming a band shape n-type electrode on the periphery of the light emitting device.

A method of manufacturing the nitride semiconductor light emitting device of the present invention as described above will now be described with FIGS. 7a to 7d.

FIGS. 7a to 7d are perspective views illustrating nitride semiconductor layers at respective steps according to a method of manufacturing a nitride semiconductor light emitting device of the present invention. The nitride semiconductor light emitting device shown in FIGS. 7a to 7d is provided with the electrode structure according to the second embodiment as described above.

Figure 7B:
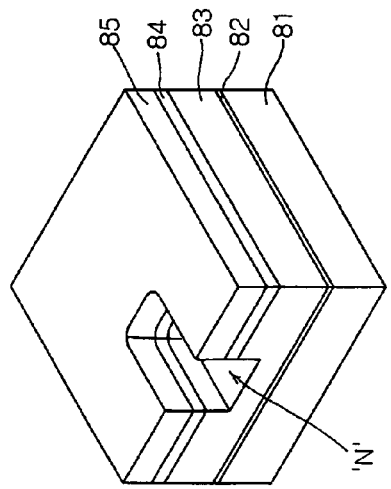
FIGS. 7a to 7d are perspective views illustrating nitride semiconductor layers at respective steps according to a method of manufacturing a nitride semiconductor light emitting device of the present invention.
Figure 7D:
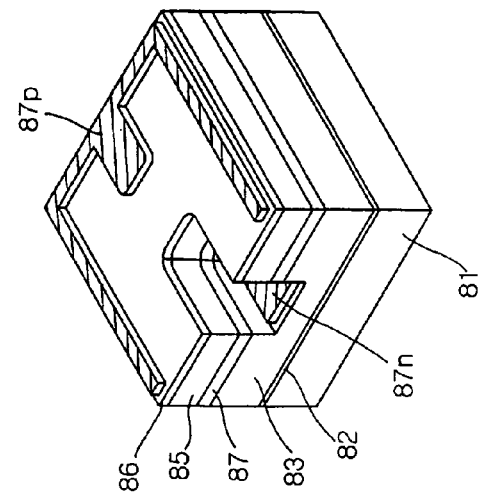
Figure 7A:
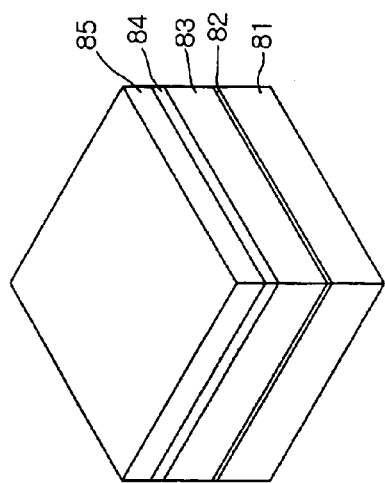
Figure 7C:
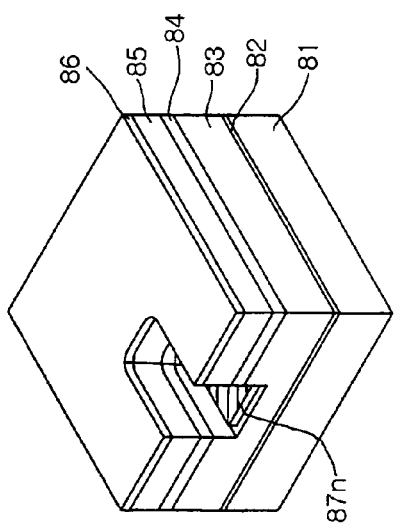

First, as shown in FIG. 7a, in order to manufacture the nitride semiconductor light emitting device, a buffer layer 82, an n-type nitride semiconductor layer 83, an activation layer 84 and a p-type nitride semiconductor layer 85 are sequentially formed on the top surface of a substrate 81. The n-type nitride semiconductor layer 83, the activation layer 84 and the p-type nitride semiconductor layer 85 may generally comprise a nitride semiconductor material having the formula $Al_xIn_yGa_{(1-x-y)}N$ (where $0 \leq x \leq 1$, $0 \leq y \leq 1$, $0 \leq x+y \leq 1$). The substrate 81 may be a sapphire substrate suitable for growing the nitride semiconductor. Further, the n-type nitride semiconductor layer 83, the activation layer 84 and the p-type nitride semiconductor layer 85 can be grown using a well-known deposition process, such as the MOCVD process or the MBE process.

Then, as shown in FIG. 7b, some portions of the activation layer and p-type nitride semiconductor layer 84 and 85 are removed by a mesa etching process such that an electrode region N of a predetermined area adjacent to the center of one lateral side of the top surface of the n-type nitride semiconductor layer 83 is exposed. The electrode region N will be formed with an n-type electrode 87n in FIG. 7d by a subsequent process. Since the nitride semiconductor light emitting device uses a dielectric substrate such as the sapphire substrate in order to grow the nitride semiconductor layer, the mesa etching process for exposing some portions of the upper surface of the n-type nitride semiconductor layer 83 is carried out in order to form the n-type electrode 87n in FIG. 7d, which is connected with the n-type nitride semiconductor layer 83. Specifically, in the present invention, in order to form the n-type electrode on the center of the lateral side of the n-type nitride semiconductor light emitting device, some portions of the activation layer and p-type nitride semiconductor layer 84 and 85 are removed such that the electrode region N of the predetermined area adjacent to the center of the lateral side of the upper surface of the n-type nitride semiconductor layer 83 is exposed.

Subsequently, a transparent layer 86 is formed to provide an ohmic contact. The transparent layer 86 is a layer for lowering the contact resistance while having translucency. The transparent layer 86 may be formed through a deposition process of a bi-layer of Ni/Au or an ITO layer on the p-type nitride semiconductor layer 85 and a subsequent heat treatment process.

Finally, as shown in FIG. 7*d*, after the n-type electrode 87*n* is formed on the electrode region N, a p-type electrode having a bonding pad and a band shape extension is formed on the transparent layer. The bonding pad is formed adjacent to the center of another lateral side opposite to the lateral side adjacent to the electrode region to have a predetermined space from the n-type electrode. Then, the extension is connected with the bonding pad to extend along the lateral side adjacent to the bonding pad in the opposite directions from the connected portion of the extension with the bonding pad and along opposite lateral sides at which the n-type electrode and the p-type bonding pad are not formed. The p-type and n-type electrodes 87*p* and 87*n* are formed of materials comprising Al and Ti, and can be simultaneously formed by the deposition process using a single photoresist pattern. When omitting the process for forming the transparent layer 86, the p-type electrode 87*p* is formed on the p-type nitride semiconductor layer 85.

Figure 8A:
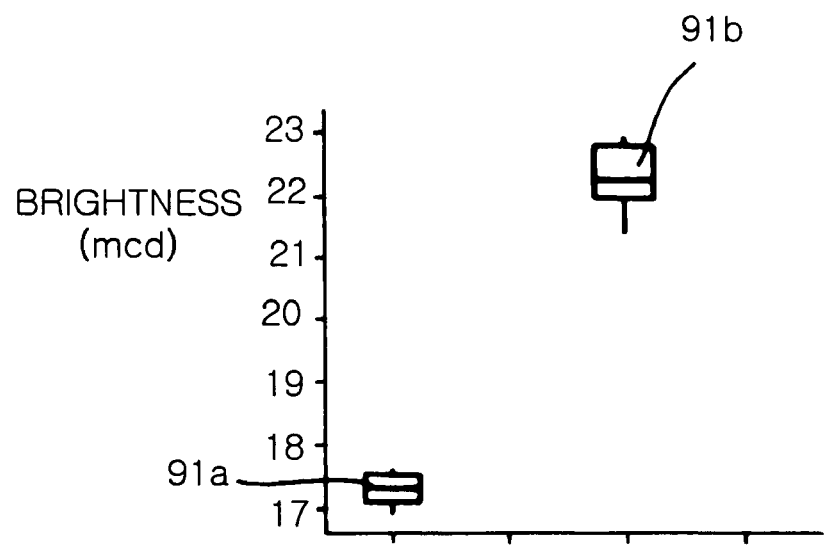
FIG. 8a is a graph comparing brightness of the conventional nitride semiconductor light emitting device with that of the nitride semiconductor light emitting device of the present invention.
Figure 8B:
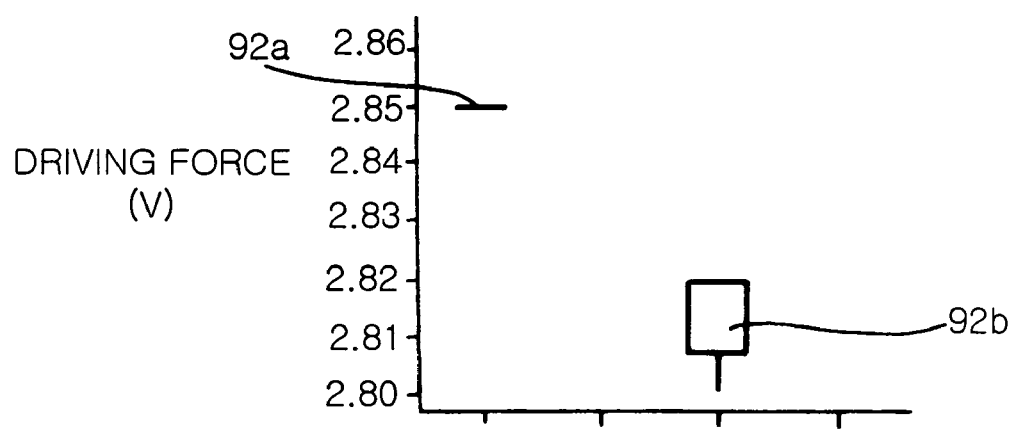
FIG. 8b is a graph comparing a driving voltage of the conventional nitride semiconductor light emitting device with that of the nitride semiconductor light emitting device of the present invention.

Graphs for comparing brightness and driving voltage characteristics of the nitride semiconductor light emitting device according to the second embodiment of the present invention with those of the conventional nitride semiconductor light emitting device shown in FIG. 1 are delineated in FIGS. 8*a* and 8*b*. The brightness and driving voltage characteristics shown in FIGS. 8*a* and 8*b* are results obtained from repeated experiments using a plurality of nitride semiconductor light emitting devices according to the second embodiment of the present invention and a plurality of conventional nitride semiconductor light emitting devices, having the same size, respectively.

First, FIG. 8*a* is a graph comparing brightness of the conventional nitride semiconductor light emitting device shown in FIG. 1 with that of the nitride semiconductor light emitting device according to the second embodiment of the present invention. As apparent from the drawing, compared with the brightness 91*c* of about 17.3 mcd on average of the conventional nitride semiconductor light emitting device, the nitride semiconductor light emitting device according to the second embodiment provides a greatly enhanced brightness 91*b* of about 22.2 mcd on average. This is attributed to the fact that the light emission of the nitride semiconductor light emitting device according to the second embodiment is carried out by uniform current diffusion over the entire light emitting region, whereas the light emission of the conventional nitride semiconductor light emitting device is mainly carried out between the p-type electrode formed on the center of the light emitting region and the n-type electrode formed on the edge thereof.

FIG. 8*b* is a graph comparing the driving voltage of the conventional nitride semiconductor light emitting device and that of the nitride semiconductor light emitting device of the present invention. As apparent from the drawing, compared with the driving voltage 92*a* of about 2.85 V on average of the conventional nitride semiconductor light emitting device, the nitride semiconductor light emitting device according to the second embodiment provides an enhanced driving voltage 92*b* of about 2.81 to 2.82 V on average, which is lower than that of the conventional light emitting device. This is attributed to the fact that with the same size, the nitride semiconductor light emitting device according to the second embodiment has a larger current flow area compared with the conventional nitride semiconductor light emitting device.

As shown in FIG. 8, the nitride semiconductor light emitting device of the present invention provides uniform current diffusion over the entire light emitting region, thereby realizing a high brightness and a reduced driving voltage.

As apparent from the above description, in accordance with the present invention, there are provided advantageous effects that the n-type electrode is formed adjacent to the center of one lateral side of the approximately rectangular nitride semiconductor light emitting device, and the p-type electrode is formed with the bonding pad adjacent to the center of another lateral side opposite to the lateral side adjacent to the n-type electrode, along with the band-shaped extension connected to the bonding pad to extend to opposite sides of the bonding pad along the lateral side of the top surface of the nitride semiconductor light emitting device, so that the distance passed by the electric current becomes approximately constant resulting in the uniform current diffusion over the entire light emitting region, thereby greatly enhancing the brightness.

Further, there is provided another advantageous effect that when manufacturing the package, the bonding wire does not block the light emitting region, thereby preventing the brightness from being reduced after manufacturing the package.

Further, there is provided still another advantageous effect that the electric current passes in an enlarged area of the nitride semiconductor light emitting device, thereby reducing the driving voltage.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A nitride semiconductor light emitting device, comprising:
   a substrate having an approximately rectangular top surface;
   an n-type nitride semiconductor layer formed on the substrate and provided with an electrode region of a predetermined area adjacent to a center of one lateral side of the top surface of the substrate;
   an n-type electrode formed on the electrode region;
   an activation layer comprising an un-doped nitride semiconductor material and formed on the n-type nitride semiconductor layer such that the electrode region is exposed;
   a p-type nitride semiconductor layer formed on the activation layer; and
   a p-type electrode formed on the p-type nitride semiconductor layer, the p-type electrode having a bonding pad adjacent to a center of another lateral side opposite to the lateral side adjacent to the electrode region to have a predetermined space from the n-type electrode and having a band-shaped extension connected to the bonding pad to extend along a lateral side, in opposite directions, at which the bonding pad is formed and along opposite lateral sides at which the n-type electrode and the bonding pad are not formed, wherein the distance between the n-type electrode and the p-type electrode is substantially constant and configured to flow current uniformly over an entire light emitting region.

2. The device as set forth in claim 1, further comprising:
a buffer layer formed on the top surface of the substrate for providing lattice matching.

3. The device as set forth in claim 1, further comprising:
a transparent layer formed on the top surface of the p-type nitride semiconductor layer for providing an ohmic contact.

* * * * *